(12) United States Patent
Mochida et al.

(10) Patent No.: US 7,470,939 B2
(45) Date of Patent: Dec. 30, 2008

(54) SEMICONDUCTOR DEVICE

(75) Inventors: Akira Mochida, Nukata-gun (JP);
Kuniaki Mamitsu, Okazaki (JP);
Kenichi Oohama, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 11/484,701

(22) Filed: Jul. 12, 2006

(65) Prior Publication Data

US 2007/0018197 A1    Jan. 25, 2007

(30) Foreign Application Priority Data

Jul. 22, 2005    (JP)    ............................... 2005-212246

(51) Int. Cl.
*H01L 31/11*    (2006.01)
(52) U.S. Cl. ........................ 257/177; 257/178; 257/182; 257/150; 257/678
(58) Field of Classification Search ......... 257/678–733, 257/787–795, E23.011–E23.194, 150, 177, 257/182, E23.026
See application file for complete search history.

(56) References Cited

U.S. PATENT DOCUMENTS

| | | | |
|---|---|---|---|
| 6,424,030 B2 * | 7/2002 | Masayuki et al. ........... 257/685 |
| 6,542,365 B2 | 4/2003 | Inoue | |
| 6,693,350 B2 | 2/2004 | Teshima et al. | |
| 6,703,707 B1 | 3/2004 | Mamitsu et al. | |
| 6,798,062 B2 | 9/2004 | Mamitsu et al. | |
| 6,845,012 B2 | 1/2005 | Ohkouchi | |
| 6,884,953 B2 | 4/2005 | Nii et al. | |
| 6,891,265 B2 | 5/2005 | Mamitsu et al. | |
| 6,960,825 B2 | 11/2005 | Mamitsu et al. | |
| 6,967,404 B2 | 11/2005 | Mamitsu et al. | |
| 6,992,383 B2 | 1/2006 | Mamitsu et al. | |
| 6,992,385 B2 * | 1/2006 | Satou et al. .................. 257/735 |
| 6,998,707 B2 | 2/2006 | Fukuda et al. | |
| 2004/0089942 A1 | 5/2004 | Mamitsu et al. | |
| 2004/0144996 A1 | 7/2004 | Inoue | |
| 2005/0040515 A1 | 2/2005 | Inoue et al. | |

FOREIGN PATENT DOCUMENTS

| | | |
|---|---|---|
| JP | U-4-113475 | 10/1992 |
| JP | A-5-29532 | 2/1993 |

* cited by examiner

*Primary Examiner*—Jasmine J Clark
(74) *Attorney, Agent, or Firm*—Posz Law Group, PLC

(57) ABSTRACT

A semiconductor device is disclosed that includes a first and a second semiconductor package. Each semiconductor package includes a semiconductor element, a plurality of electrode members, and an encapsulating member. The semiconductor elements are interposed between the respective electrode members, and the electrode members are in electrical communication with and provide heat transfer for the respective semiconductor element. The encapsulating member encapsulates the respective semiconductor element between the respective electrode members, and an outer surface of each of the electrode members is exposed from the respective encapsulating member. Each semiconductor package includes a connecting terminal electrically coupled to one of the electrode members and extending outward so as to be exposed from the respective encapsulating member. The connecting terminals are electrically connected by abutment or via a conductive junction material.

14 Claims, 7 Drawing Sheets

SEMICONDUCTOR DEVICE

CROSS REFERENCE TO RELATED APPLICATION

The following is based on and claims the benefit of priority on Japanese Patent Application No. 2005-212246, filed Jul. 22, 2005, and is incorporated herein by reference.

FIELD OF THE INVENTION

The present invention relates to a semiconductor device with a plurality of semiconductor packages, each with semiconductor elements interposed between electrodes and encapsulated by an encapsulating member with connecting terminals.

BACKGROUND

Semiconductor packages have been proposed that include semiconductor elements sandwiched between a pair of metal bodies and sealed with a mold resin. The metal bodies function as electrodes and as heat transfer members for the semiconductor elements. (See. e.g., Japanese Patent Publication No. 3596388, U.S. Patent Publication 2004/0089941, U.S. Patent Publication 2004/0089940, and U.S. Pat. Nos. 6,998,707, 6,992,383, 6,967,404, and 6,960,825.)

In such a semiconductor package, external surfaces of the metal bodies (i.e., surfaces opposite to surfaces facing the semiconductor elements) are exposed from the mold resin to thereby enable heat transfer therefrom. Also, a connecting terminal exposed from the mold resin on one of the metal bodies is provided for electrically connecting to an external component.

An inverter device or another device be constructed using a plurality of these semiconductor packages. The semiconductor packages are electrically connected through the respective connecting terminals using a bus bar.

However, inductance may increase due to the use of the bus bar, which is undesirable. The inductance may cause a relatively large surge voltage, and accordingly the surge voltage may increase a load to semiconductor elements in the semiconductor package.

SUMMARY OF THE INVENTION

A semiconductor device is disclosed that includes a first and a second semiconductor package. Each semiconductor package includes a semiconductor element, a plurality of electrode members, and an encapsulating member. The semiconductor elements are interposed between the respective electrode members, and the electrode members are in electrical communication with and provide heat transfer for the respective semiconductor element. The encapsulating member encapsulates the respective semiconductor element between the respective electrode members, and an outer surface of each of the electrode members is exposed from the respective encapsulating member. Each semiconductor package includes a connecting terminal electrically coupled to one of the electrode members and extending outward so as to be exposed from the respective encapsulating member. The connecting terminals abut each other so as to establish electrical connection between the first and second semiconductor packages.

A semiconductor device is also disclosed that includes a first and a second semiconductor package. Each semiconductor package includes a semiconductor element, a plurality of electrode members, and an encapsulating member. The semiconductor elements are interposed between the respective electrode members, and the electrode members are in electrical communication with and provide heat transfer for the respective semiconductor element. The encapsulating member encapsulates the respective semiconductor element between the respective electrode members, and an outer surface of each of the electrode members is exposed from the respective encapsulating member. Each semiconductor package includes a connecting terminal electrically coupled to one of the electrode members and extending outward so as to be exposed from the respective encapsulating member. A conductive junction material is interposed between the connecting terminals so as to establish electrical connection between the first and second semiconductor packages.

DETAILED DESCRIPTION OF THE PREFERRED EMBODIMENTS

Figure 1A:
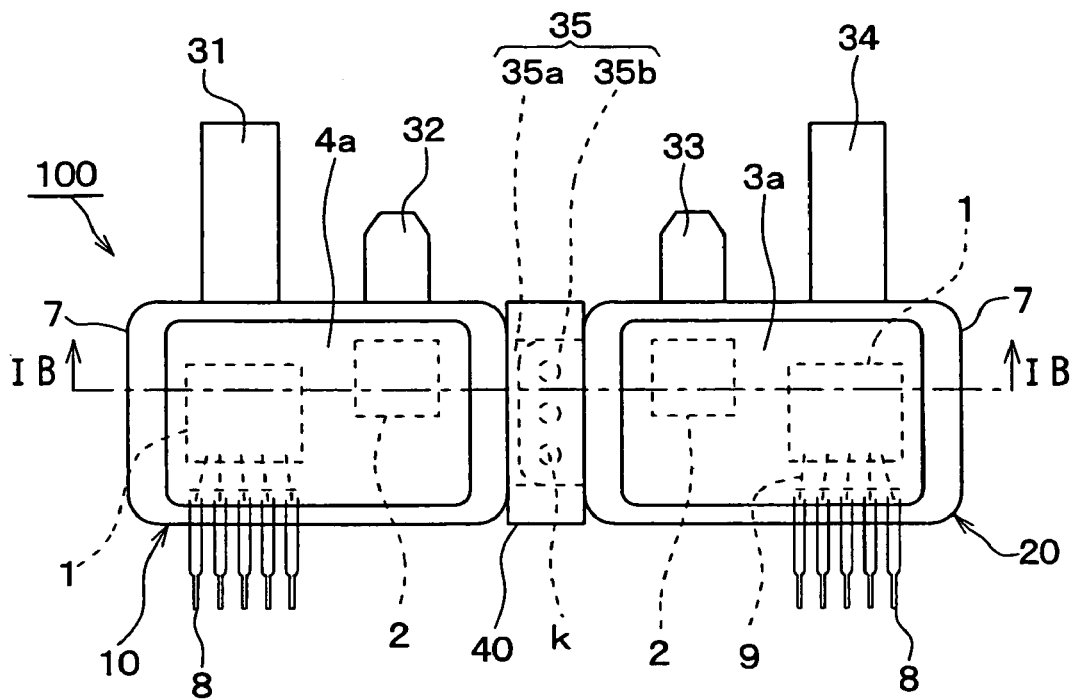
FIG. 1A is a plan view of one embodiment of a semiconductor device according to the present invention.

Hereafter, embodiments of this invention will be described with reference to the drawings. Incidentally, in figures shown below, any parts that are mutually equal or equivalent are given the same reference numeral in the figures in order to simplify its explanation.

Figure 1B:
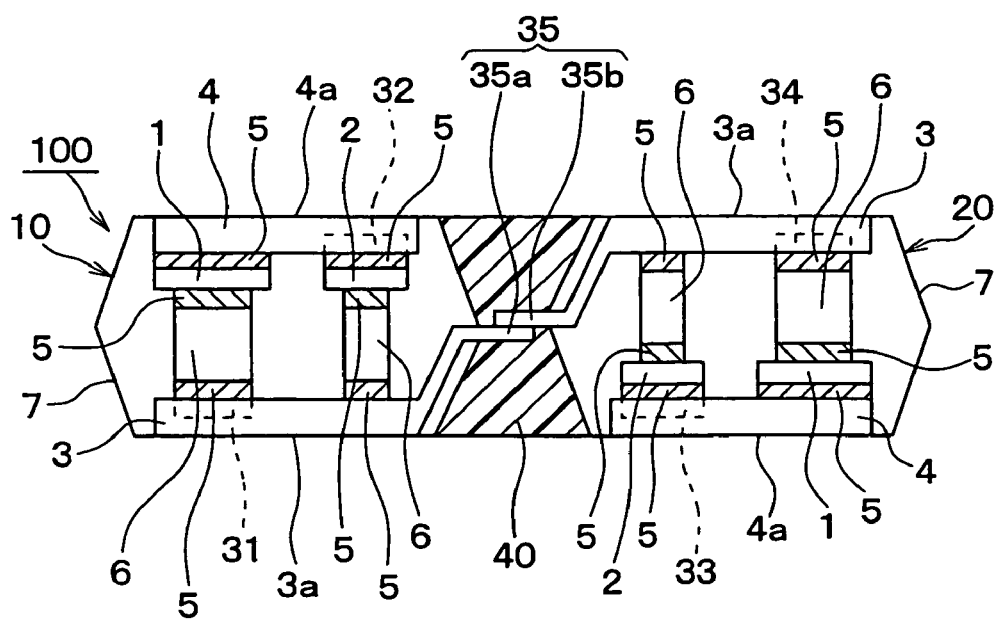
FIG. 1B is a section view of the semiconductor device taken along the line IB-IB of FIG. 1A.

Referring initially to FIGS. 1A and 1B, one embodiment of a semiconductor device 100 is shown. In one embodiment, the semiconductor device 100 is carried onboard a vehicle (e.g., an automobile, etc.), and the semiconductor device 100 is employed as an inverter device for operating a vehicular motor.

The semiconductor device 100 includes a first semiconductor package 10 and a second semiconductor package 20.

Figure 2:
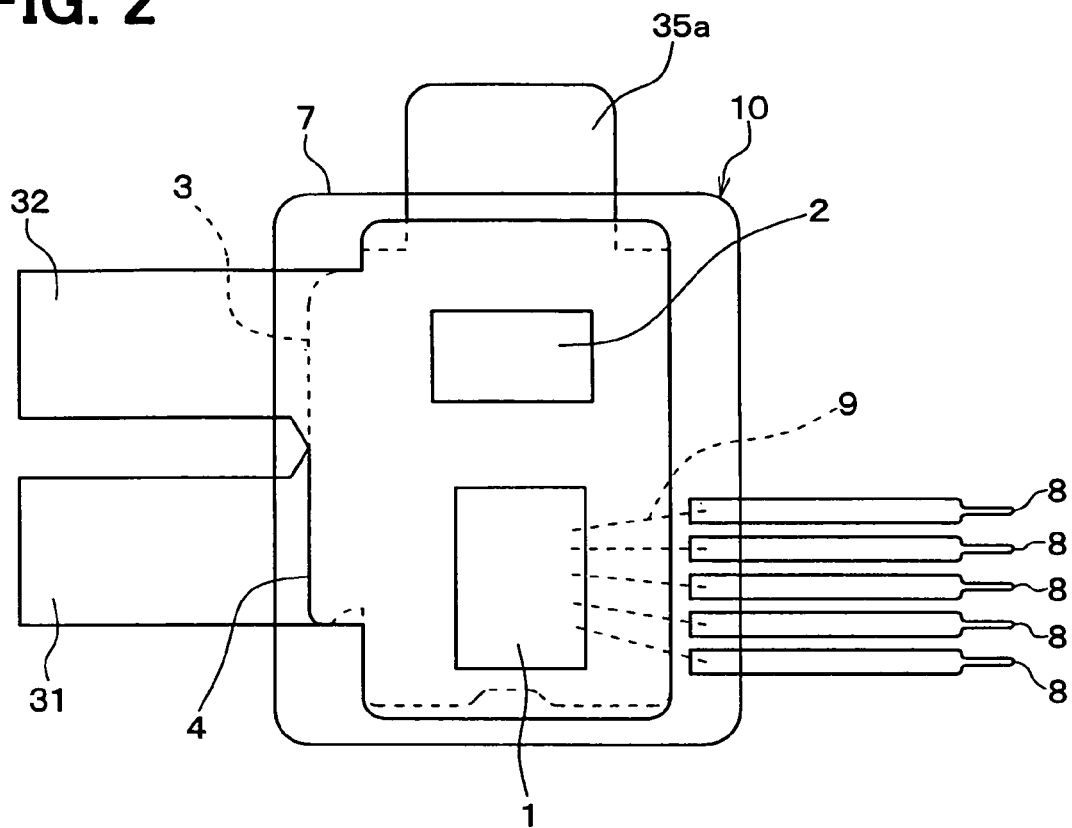
FIG. 2 is a plan view of a first semiconductor package of the semiconductor device of FIG. 1A.

Only the first semiconductor package 10 is shown in FIG. 2 for clarity. It will be appreciated that the second semiconductor package 20 has substantially the same construction as the first semiconductor package 10. However, the second semiconductor package 20 is inverted by 180 degrees with respect to the first semiconductor package 10.

As shown in FIGS. 1A, 1B, and FIG. 2, the first and second semiconductor packages 10, 20 each include two respective semiconductor elements 1, 2. The semiconductor elements 1, 2 are arranged in a common plane. In one embodiment, the first semiconductor element 1 is an IGBT (Insulated-Gate type Bipolar Transistor), and the second semiconductor element 2 is a FWD (FlyWheel Diode).

Moreover, the first and second semiconductor packages 10, 20 each include a first and second electrode member 3, 4. The first and second electrode members 3, 4 are made out of metal having relatively high thermal and electrical conductivity (e.g., copper alloy, aluminum alloy, etc.). Also, in the embodiment shown, the first and second electrode members 3, 4 are shaped as plates. In each semiconductor package 10, 20, the first and second semiconductor elements 1, 2 are interposed between the respective pair of electrode members 3, 4. As will be explained in greater detail, the electrode members 3, 4 are in electrical communication with the respective semiconductor elements 1, 2. Also, as will be explained in greater detail, the electrode members 3, 4 provide heat transfer for the respective semiconductor elements 1, 2.

As shown in FIG. 1B, a first electrode member 3 of the first semiconductor package 10 is located below and spaced from a second electrode member 4. In contrast, for the second semiconductor package 20, the first electrode member 3 is located above the second electrode member 4.

Furthermore as shown in FIG. 1B, in the both semiconductor packages 10, 20 an internal surface of the respective second electrode member 4 and one surface of the respective semiconductor elements 1, 2 are electrically and thermally connected with a conductive junction material 5. Furthermore, in each semiconductor package 10, 20 a heat sink block 6 is interposed between the respective first electrode member 3 and the other surface of the respective semiconductor devices 1, 2. Conductive junction material 5 electrically and thermally connects the heat sink blocks 6 to the first and second semiconductor elements 1, 2, respectively. Also, conductive junction material 5 electrically and thermally connects the heat sink blocks 6 to an internal surface of the first electrode member 3, respectively. The conductive junction material 5 can be of any suitable type, such as solder, conductive adhesive, etc. Additionally, in one embodiment, the heat sink blocks 6 are made of the same material as that of the electrode members 3, 4.

Moreover, each of the semiconductor packages 10, 20 include an encapsulating member 7. A first encapsulating member 7 at least partially covers the periphery between the first and second electrode members 3, 4 of the first semiconductor package 10. As such, the first encapsulating member 7 encapsulates and seals the first and second semiconductor elements 1, 2 within the first and second electrode members 3, 4 of the first semiconductor package 10. Likewise, a second encapsulating member 7 at least partially covers the periphery between the first and second electrode members 3, 4 of the second semiconductor package 20. As such, the second encapsulating member 7 encapsulates and seals the first and second semiconductor elements 1, 2 within the first and second electrode members 3, 4 of the second semiconductor package 20. The encapsulating member can be made out of any suitable material, such as a mold resin made of epoxy based resin, etc. Also, in one embodiment, the encapsulating member is formed into shape by die forming.

As shown in FIG. 1B, the electrode members (3, 4) each include an outer surface 3a, 4a that is not covered by the respective encapsulating member 7. As such, the outer surfaces 3a, 4a are exposed from the respective encapsulating member 7. As such, one surface of each first semiconductor element 1 can conduct heat through one electrode member 4 and through the outer surface 4a, and the opposite surface of each first semiconductor element 1 can conduct heat through the respective heat sink block 6, through the other electrode member 3, and through the outer surface 3a. Furthermore, one surface of each second semiconductor element 2 can conduct heat through one electrode member 4 and through the outer surface 4a, and the opposite surface of each second semiconductor element 2 can conduct heat through the respective heat sink block 6, through the other electrode member 3, and through the outer surface 3a.

In one embodiment, electrode members 3, 4 are electrically connected to electrodes (not shown) of the two semiconductor elements 1, 2 (i.e., vertical-type power elements) through the conductive junction material 5 and the heat sink blocks 6, respectively.

Here, as shown in FIG. 2, the electrode members 3, 4 of the first semiconductor package 10 are each provided with an external terminal 31, 32, respectively. Likewise, the electrode members 3, 4 of the second semiconductor package 20 are each provided with an external terminal 33, 34, respectively. The external terminals 31, 32, 33, 34 protruded from the respective encapsulating member 7 to be exposed. The external terminals 31-34 can be attached to the respective electrode member 3, 4 in any suitable fashion, such as integral-molding, press processing, soldering, etc.

In one embodiment, the external terminal 31 provided on the electrode member 3 of the first semiconductor package 10 is an output terminal connected to the above-mentioned vehicular motor. Moreover, the external terminal 32 provided on the electrode member 4 of the first semiconductor package 10 and the external terminal 33 provided on the electrode member 4 of the second semiconductor package 20 are each power supply terminals in this semiconductor device 100. In this embodiment, the terminal 32 of the first semiconductor package 10 side a high voltage side, and the terminal 33 of the second semiconductor package 20 side is a GND side. Here, the terminal 31 (i.e., output terminal) will be any one of so-called U, V, and W terminals in the inverter device. The terminal 32 (i.e., high voltage power terminal) is a so-called P terminal, and the terminal 33 (i.e., GND power terminal) is a so-called N terminal.

Moreover, although the external terminal 34 of the second semiconductor package 20 exists because of adoption of a configuration of using the same two semiconductor packages 10, 20, the external terminal 34 may be unnecessary in certain embodiments of the semiconductor device 100. Thus, in one embodiment, the external terminal 34 is included in the semiconductor device 100. In another embodiment, the external terminal 34 is not included. For instance, in one embodiment the external terminal 34 is removed by cutting from the semiconductor device 100.

Furthermore, the first semiconductor package 10 includes a first connecting terminal 35a, and the second semiconductor package 20 includes a second connecting terminal 35b. The first and second connecting terminals 35a, 35b are made out of an electrically conductive material (e.g., the same material as the electrode members 3, 4). Furthermore, the first connecting terminal 35a is electrically coupled to the electrode member 3 of the first semiconductor package 10, and the second connecting terminal 35b is electrically coupled to the electrode member 3 of the second semiconductor package 20. The connecting terminals 35a, 35b can be coupled to the respective electrode member 3 in any suitable fashion (e.g., integrally coupled, press fit, soldering, etc.). The first connecting terminal 35a extends outward so as to be exposed from the encapsulating member 7 of the first semiconductor package 10, and the second connecting terminal 35b extends outward so as to be exposed from the encapsulating member 7 of the second semiconductor package 20. As will be discussed in greater detail, the first and second connecting terminals 35a, 35b are electrically connected to each other such that the first and second semiconductor packages 10, 20 are electrically connected to each other.

As shown in FIG. 1B, the electrode members 3, 4 of each semiconductor package 10, 20 are disposed in spaced relationship relative to each other in a first direction (i.e., vertically in FIG. 1B). The first and second electrode packages 10, 20 are arranged relative to each other in a second direction (i.e., horizontally in FIG. 1B). Thus, the first and second directions are approximately orthogonal to each other. Also, the connecting terminals 35a, 35b extend outward along the second direction (i.e., horizontally in FIG. 1B). As such, the connecting terminals 35a, 35b extend toward each other.

Furthermore, in the embodiment shown, the first semiconductor package 10 is inverted by 180 degrees relative to the second semiconductor package 20. As such, the vertical positions of the electrode members 3, 4 of the first semiconductor package 10 are reversed relative to the vertical positions of the electrode members 3, 4 of the second semiconductor package 20.

As shown in FIG. 1B, the connecting terminals 35a, 35b include a bent portion such that one end of the connecting terminal 35a, 35b is connected to the respective electrode member 3 and the other end is vertically spaced from the electrode member 3. As such, the connecting terminals 35a, 35b bend toward each other for establishing electrical connection therebetween.

In the example shown in FIGS. 1A and 1B, the connecting terminals 35a, 35b abut each other so as to establish electrical connection therebetween. In one embodiment, the connecting terminals 35a, 35b are further spot welded at two or more welding points K (FIG. 1A). Thus, the connecting terminals 35a, 35b are electrically connected by being abutted, overlapped, and spot-welded.

The connecting terminals 35a, 35b are connected at a connecting part. The connecting part is covered with an electrically insulating member 40. In one embodiment, the insulating member 40 is formed by die forming, coating, or the like using an epoxy based resin etc.

Moreover, as shown in FIGS. 1A and 2, in each of the two semiconductor packages 10, 20, a control terminal 8 comprising a lead frame etc. is provided inside the mold resin 7 adjacent the first respective semiconductor element 1. The control terminals 8 allow transmission of signal for controlling the respective first semiconductor element 1. One end of each control terminal 8 protrudes from the encapsulating member 7 and is connected to a circuit substrate (not shown). Each first semiconductor element 1 is electrically connected to the respective control terminal 8 through a bonding wire 9 on the heat sink block 6 side surface. The heat sink block 6 ensures an adequate height between the wire bonding surface of the first semiconductor element 1 and the electrode member 3 in order to maintain the height of the wire 9.

Thus, the control terminal 8 is connected to the above-mentioned circuit substrate, the first semiconductor element 1 is controlled by a control circuit of the circuit substrate, and a direct voltage is inputted from a converter (not shown) through the power supply terminals 32, 33, converted into an alternating current, and outputted from the output terminal 31 to the vehicular motor (not shown). Thus, this semiconductor device 100 functions as the above-mentioned inverter device.

In one embodiment, the semiconductor device 100 is produced by manufacturing the semiconductor packages 10, 20 separately. Then, the connecting terminals 35a, 35b are electrically connected (e.g., by abutment and welding). Next, the insulating member 40 is formed to cover the connecting terminals 35a, 35b.

Because electrical connection between the connecting terminal 35a of the first semiconductor package 10 and the connecting terminal 35b of the second semiconductor package 20 is established by abutment the two terminals 35a, 35b, the semiconductor packages 10, 20 are electrically connected in a more reliable fashion. Specifically, surge voltage is less likely to be generated by inductance as compared to prior art packages that are connected via a bus bar, which increases load on the semiconductor elements 1, 2 in the semiconductor packages 10, 20.

Alternatively, to reduce the spurious inductance, a configuration in which more semiconductor elements are arranged and connected inside a single semiconductor package. However, this configuration may cause problems related to the yields of the semiconductor elements, warping of the package due to an enlargement of the mold, a yield of the mold, etc. In contrast, for the present embodiment of the semiconductor device 100, the package connection structure has reduced spurious inductance, and the size of the mold remains relatively small.

Figure 3A:
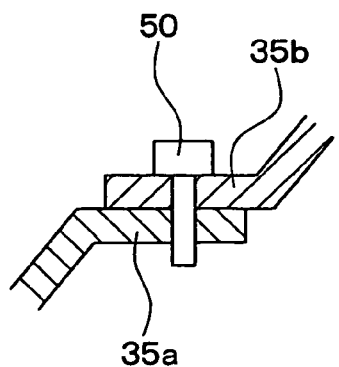
FIGS. 3A and 3B are sectional views of various embodiments of the electrical connection of the semiconductor packages of the semiconductor device.

It is noted that the abutting electrical connection of the terminals 35a, 35b can be achieved in any suitable fashion other than welding. For instance, referring to FIG. 3A, a fastener 50 (e.g., a screw, bolt, etc.) extends through the terminals 35a, 35b and is used for retaining the terminals 35a, 35b in abutting contact. Any number of fasteners 50 may be used. For instance, in one embodiment, fasteners 50 are included at the locations K shown in FIG. 1A. In this way, electrical connection is established by abutting the two connecting terminals 35a, 35b and retaining them with the fastener 50. Also, since the fastener(s) 50 can be removed, it is easy to replace or repair the semiconductor packages 10, 20 when one of the semiconductor packages 10, 20 malfunctions, etc.

Figure 3B:
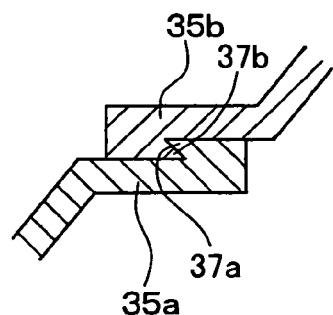

Referring to FIG. 3B, another method of electrically connecting the terminals 35a, 35b is shown. In this embodiment, the terminals 35a, 35b each include an engagement member 37a, 37b. In the embodiment shown, the engagement members 37a, 37b are ridges of material that extend from the terminals 35a, 35b. The engagement member 37a, 37b engage with each other to inhibit axial movement of the terminals 35a, 35b away from each other. Thus, the engagement members 37a, 37b ensure that the terminals 35a, 35b will remain in abutting contact. It will be appreciated that the engagement members 37a, 37b could be of any suitable shape without departing from the scope of the present disclosure.

Figure 4:
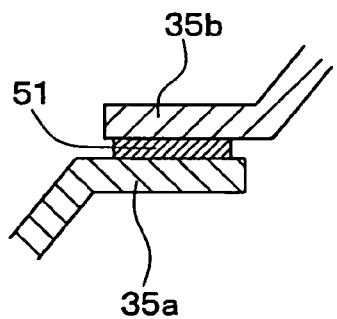
FIG. 4 is a sectional view of another embodiment of the electrical connection of the semiconductor packages of the semiconductor device.

Referring now to FIG. 4, another embodiment of the semiconductor device 100 is shown, in which electrical connection between the connecting terminals 35a, 35b is established with a conductive junction material 51. In one embodiment, the conductive junction material 51 is a solder. In another embodiment, the conductive junction material 51 is a conductive adhesive. In still another embodiment, the conductive junction material 51 is a brazing filler material. It will be appreciated, however, that the conductive junction material 51 could be of any suitable material without departing from the scope of the present disclosure.

Thus, the first and second semiconductor packages 10, 20 can be electrically connected using the conductive junction material 51 instead of a bus bar. Accordingly, the semiconductor packages 10, 20 are electrically connected in a more reliable fashion. Specifically, surge voltage is less likely to be generated by inductance as compared to prior art packages that are connected via a bus bar, which increases load on the semiconductor elements 1, 2 in the semiconductor packages 10, 20.

Figure 5A:
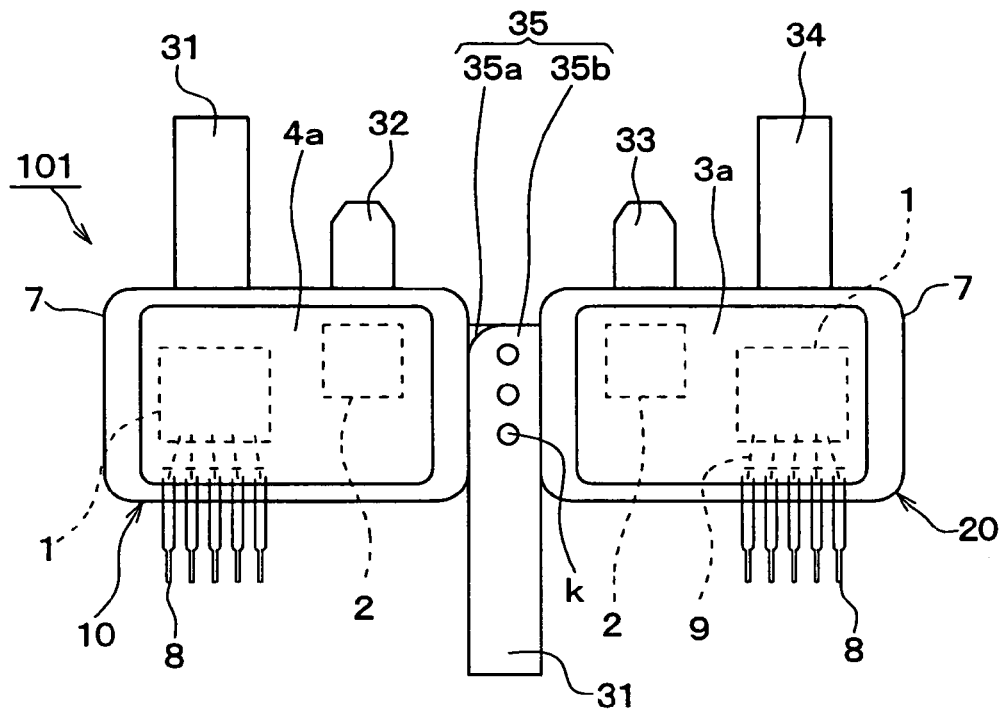
FIG. 5A is a plan view of another embodiment of the semiconductor device.
Figure 5B:
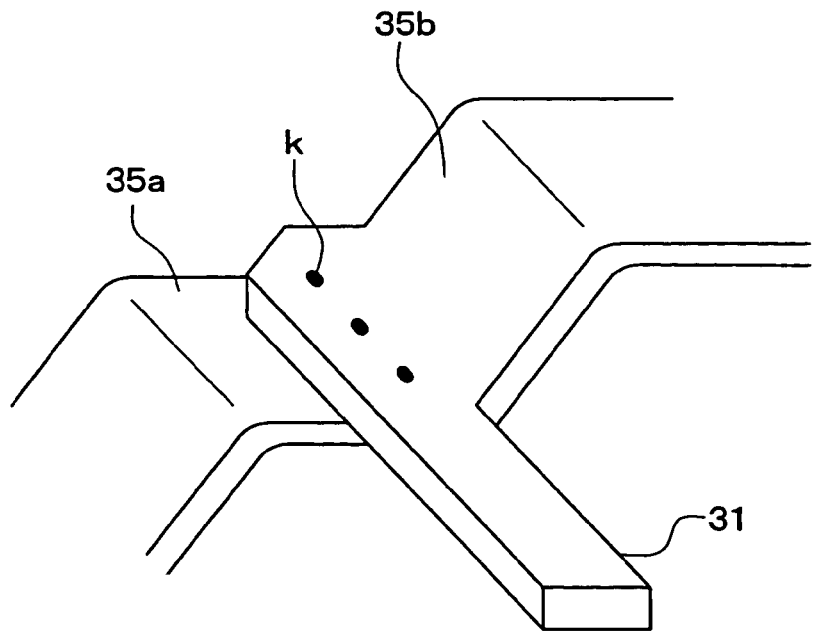
FIG. 5B is a perspective view of a portion of the semiconductor device of FIG. 5A.

Referring now to FIGS. 5A and 5B, another embodiment of the semiconductor device 101 is shown. FIG. 5A is an outline plan view of the semiconductor device 101, and FIG. 5B is a perspective view showing the connecting terminals 35a, 35b of FIG. 5A. The insulating member 40 is omitted in FIG. 5. In this embodiment, the above-mentioned output terminal 31 of the semiconductor device 101 is structured as a portion extending from the connecting terminal 35b of the second semiconductor package 20.

Figure 6:
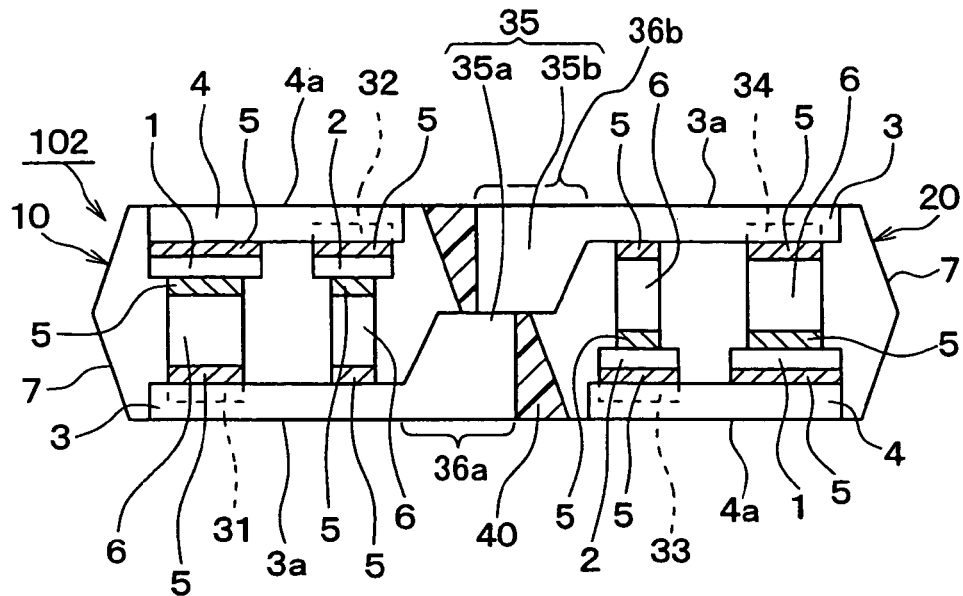
FIG. 6 is a section view of another embodiment of the semiconductor device.

Another embodiment of the semiconductor device 102 is shown in FIG. 6. Specifically, FIG. 6 is a cross-sectional view of the semiconductor device 102. In this embodiment, each of the connecting terminals 35a, 35b of the first and second semiconductor packages 10, 20 are thicker than those shown in the embodiment of FIGS. 1A and 1B. More specifically, the first connecting terminal 35a is coupled to the electrode member 3 of the first semiconductor package 10 such that an outer surface 36a of the first connecting terminal 35a is coplanar with the outer surface 3a of the electrode member 3. Likewise, the second connecting terminal 35b is coupled to the electrode member 3 of the second semiconductor package 20 such that an outer surface 36b of the second connecting terminal 35b is coplanar with the outer surface 3a of the electrode member 3. As such, both the outer surfaces 36a, 36b of the terminals 35a, 35b are exposed from the encapsulating members 7 and are exposed from the insulating member 40. Accordingly, the outer surfaces 36a, 36b can provide additional heat transfer for the semiconductor elements 1, 2 such that the heat radiation capability of the semiconductor device 102 is improved.

Figure 7A:
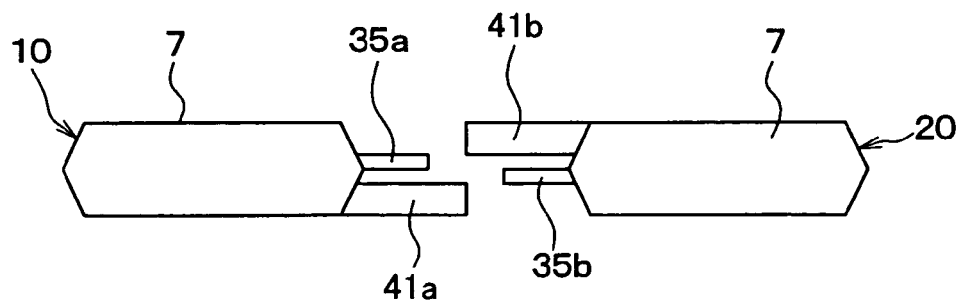
FIGS. 7A and 7B are side views of another embodiment of the semiconductor device.
Figure 7B:
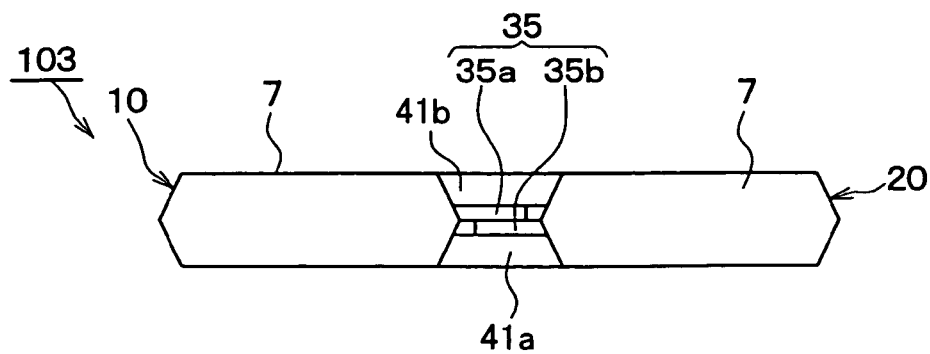

Referring now to FIGS. 7A and 7B, another embodiment of the semiconductor device 103 is shown. Specifically, FIG. 7A is a view showing a state before the two semiconductor packages 10, 20 are assembled, and FIG. 7B is a view showing a state after the two semiconductor packages 10, 20 are assembled. For clarity, FIGS. 7A and 7B show only the encapsulating members 7, the insulating member 41, and the connecting terminals 35a, 35b.

In the example shown, the insulating member 41 includes a first protruding portion 41a and a second protruding portion 41b. The first protruding portion 41a is coupled to the encapsulating member 7 of the first semiconductor package 10, and the second protruding portion 41b is coupled to the encapsulating member 7 of the second semiconductor package 20. In one embodiment the protruding portions 41a, 41b are integrally coupled to the respective encapsulating members 7, for instance, by molding with a mold resin. When the semiconductor packages 10, 20 are assembled together, the protruding portions 41a, 41b cooperate to cover and electrically insulate the first and second connecting terminals 35a, 35b.

It will be appreciated that the connecting terminals 35a, 35b can be electrically connected in any suitable fashion, for instance, via the conductive junction material 51 of FIG. 4, welding, fasteners, and the like. Moreover, there may be any number of protruding portions 41a, 41b. For instance, two or more protruding portions may be formed on each of the two semiconductor packages 10, 20 for cooperatively covering the connecting terminals 35a, 35b.

Figure 8A:
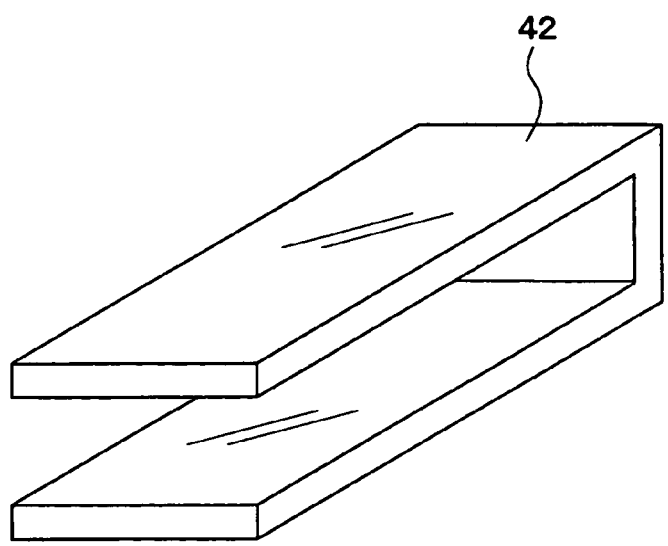
FIG. 8A is a perspective view of one embodiment of an insulating member for the semiconductor device.
Figure 8B:
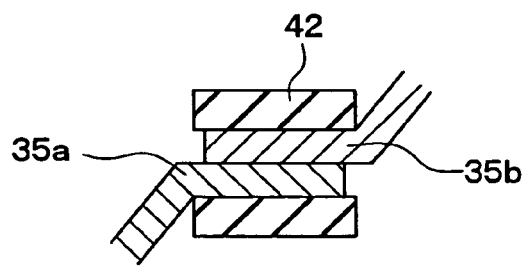
FIG. 8B is a section view of the assembled semiconductor device with the insulating member of FIG. 8A.

Referring now to FIG. 8A, another embodiment of the insulating member 42 is shown. FIG. 8B is a cross-sectional view showing the insulating member 42 in an assembled state. The insulating member 42 is made from rubber or a resin, and is approximately U-shaped. The insulating member 42 at least partially encloses the connecting terminals 35a, 35b. In other words, the insulating member 42 sandwiches the two connecting terminals 35a, 35b in an area where the connecting terminals 35a, 35b are connected. This covers the connecting terminals 35a, 35b with the insulating member 42. Furthermore, the insulating member 42 is removably attached to the first and second connecting terminals 35a, 35b. More specifically, the insulating member 42 can be elastically deformed for removal from the connecting terminals 35a, 35b.

Figure 9:
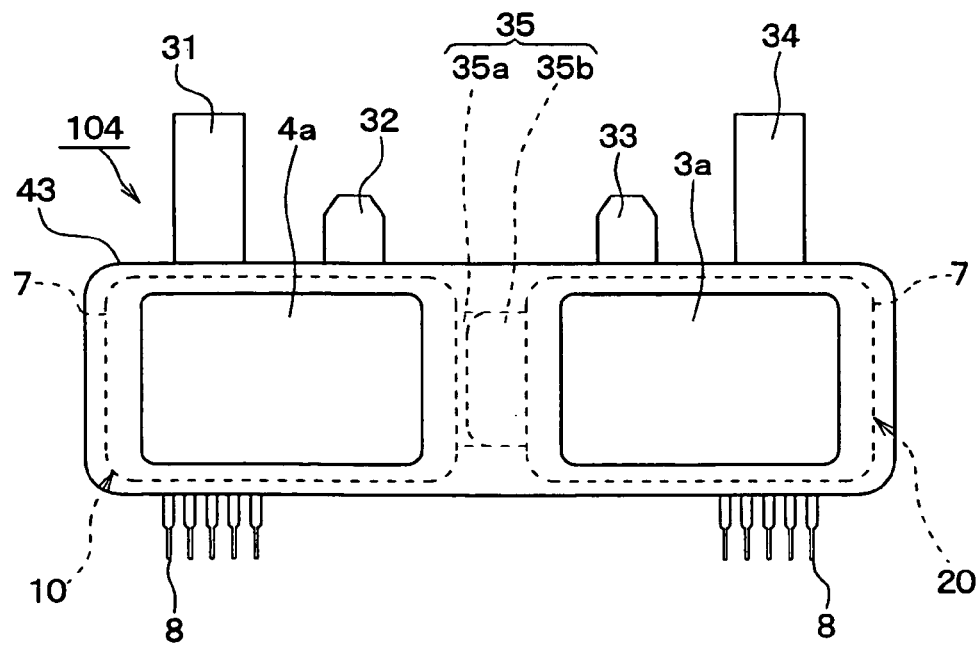
FIG. 9 is a plan view of another embodiment of the semiconductor device.

Now referring to FIG. 9, another embodiment of the semiconductor device 104 is shown. In this embodiment, the insulating member 43 covers almost all of the semiconductor device 104. Only the outer surfaces 3a, 4a of the electrode members 3, 4, and the terminals 8, 31-34 are left exposed from the insulating member 43. In one embodiment, the insulating member 43 is made out of epoxy.

Figure 10A:
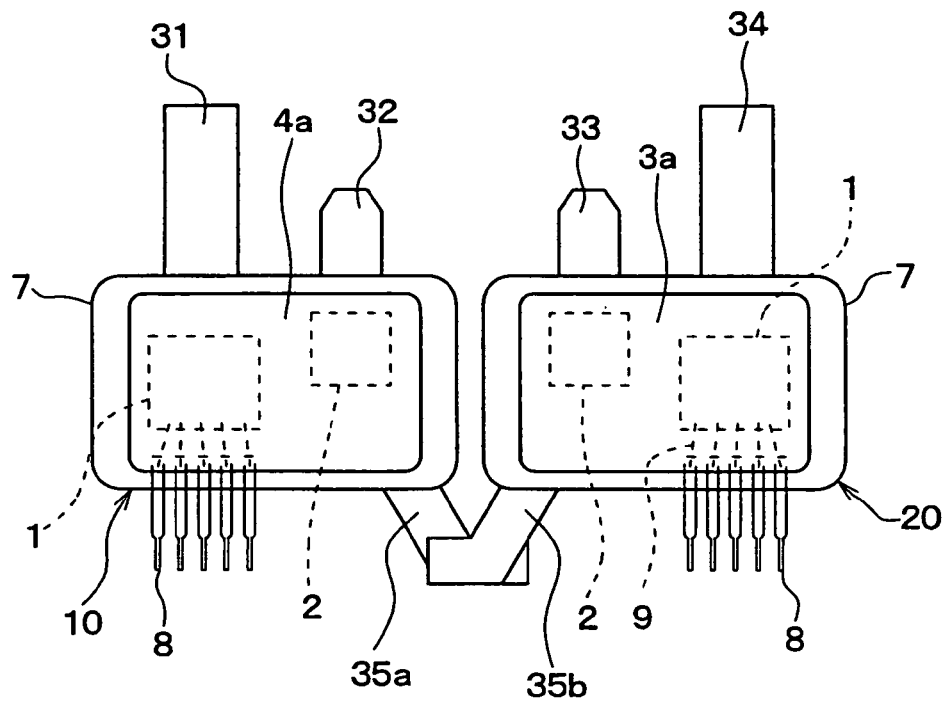
FIGS. 10A and 10B are plan views of another embodiment of the semiconductor device.
Figure 10B:
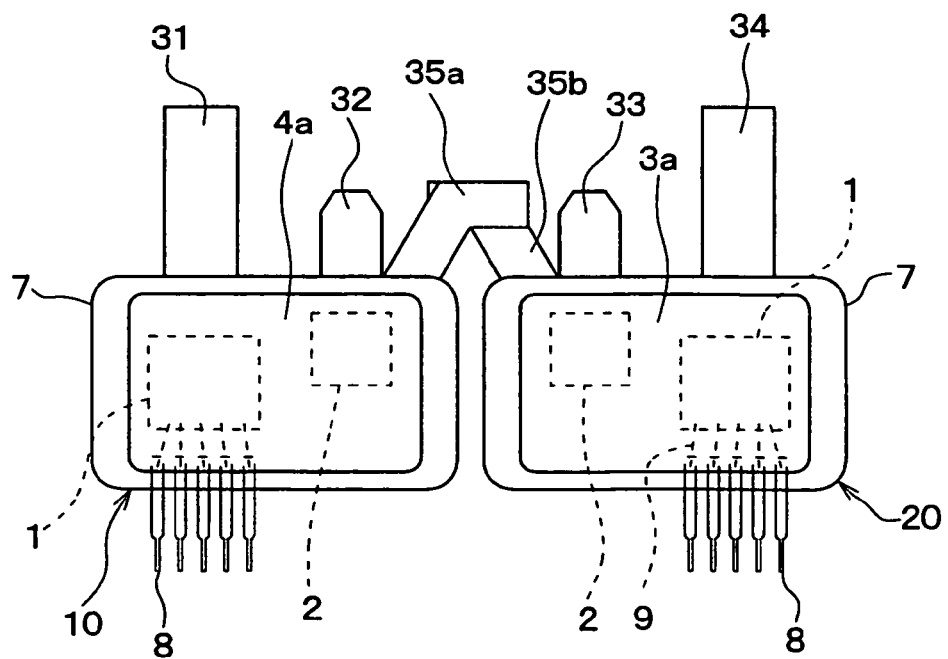

In addition, FIGS. 10A and 10B show another embodiment of the semiconductor device. As shown in FIGS. 10A and 10B, the connecting terminals 35a, 35b protrude away from the respective semiconductor package 10, 20 in a transverse direction (i.e., away from the opposing semiconductor package 10, 20). A terminal end of the connecting terminal 35a, 35b is turned in the longitudinal direction (i.e., toward the opposing semiconductor package 10, 20) so as to establish electrical connection with the opposing connecting terminal 35a, 35b. In one embodiment, the connecting terminals 35a, 35b make an oblique bend so that the lengths of the terminals 35a, 35b are shortened, as shown in FIGS. 10A and 10B, rather than making a ninety degree bend. Thus, spurious inductance is less likely.

Figure 11:
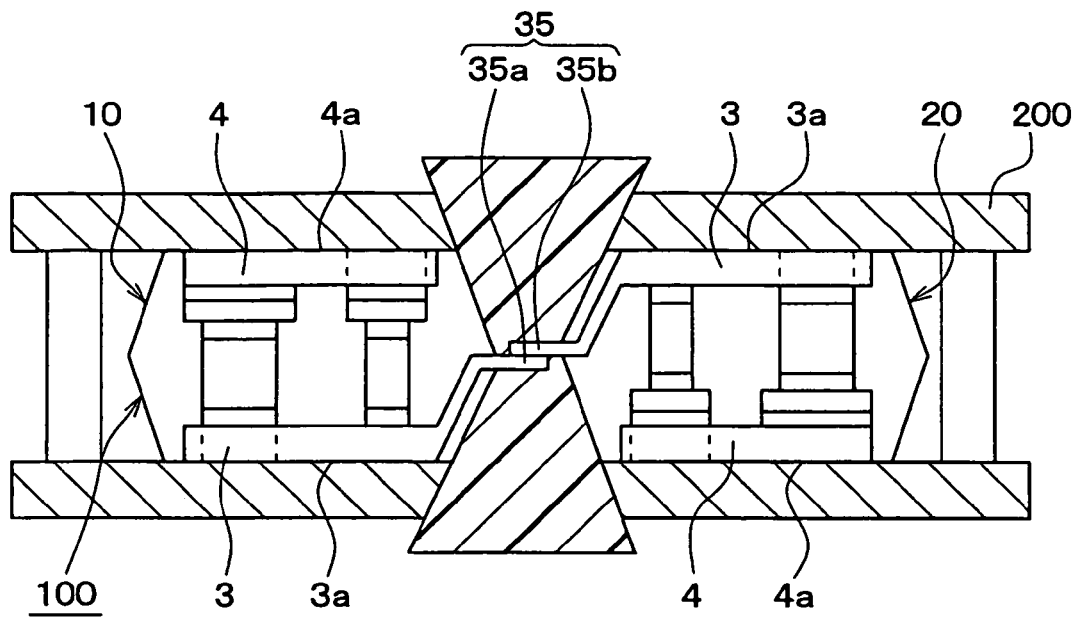
FIG. 11 is a sectional view of another embodiment of the semiconductor device.

Furthermore, in one embodiment shown in FIG. 11, the semiconductor device 100 is disposed within a cooler 200 for improved heat transfer. More specifically, the semiconductor device 100 is enclosed within the cooler 200, and the external surfaces 3a, 4a of the electrode members 3, 4 abut against the cooler 200. In one embodiment the cooler 200 is generally known and includes metal plates of aluminum, Cu, or the like. The cooler 200 includes a fluid path for circulating a coolant fluid, such as water. The cooler 200 is attached to the semiconductor device 100 by fasteners or in another suitable method.

In this embodiment, an aperture is provided in the cooler 200 adjacent the connecting terminals 35a, 35b (i.e., above and below the area in which the connecting terminals 35a, 35b are in electrical connection). The insulating member 40 (comprising a resin, etc.) is press-fitted in the aperture and solidified. As such, the insulating member 40 provides visual indication of the relative position between the semiconductor device 100 and the cooler 200 for easier assembly.

Figure 12:
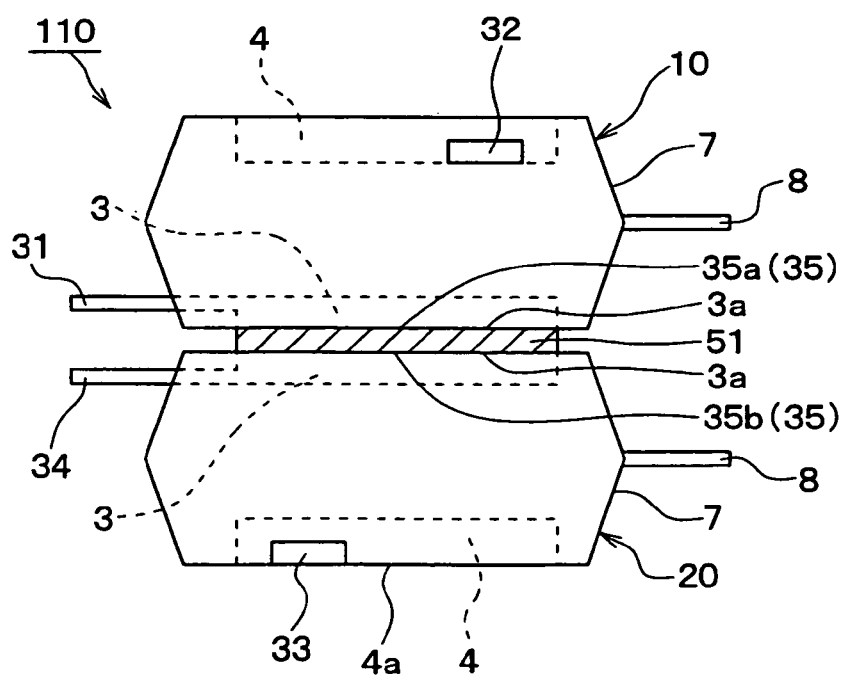
FIG. 12 is an end view of another embodiment of the semiconductor device.

Referring now to FIG. 12, another embodiment of the semiconductor device 100 is shown. As shown in FIG. 12, the electrode members 3, 4 of the first semiconductor package 10 and the electrode members 3, 4 of the second semiconductor package 20 are disposed in spaced relationship along a first direction (i.e., vertically in FIG. 12). Likewise, the first and second semiconductor packages 10, 20 are stacked in the same direction (vertically in FIG. 12).

The outer surface 3a of the electrode member 3 of the first semiconductor package 10 is the first connecting terminal 35a, and the outer surface 3b of the electrode member 3 of the second semiconductor package 10 is the second connecting terminal 35b. By stacking the first and second semiconductor packages 10, 20, the first and second connecting terminals 35a, 35b can be mated and electrically connected via the conductive connecting member 51.

As such, the connecting terminals 35a, 35b of the semiconductor device 110 are easily formed. Also, the semiconductor packages 10, 20 can be positioned closely together such that inductance is reduced.

It will be appreciated that the outer surfaces 4a of the electrode members 4 could be utilized as the first and second connecting terminals 35a, 35b. Furthermore, the external surface 3a of one semiconductor package 10, 20 and the external surface 4a of the other semiconductor package 10, 20 could be utilized as the first and second connecting terminals 35a, 35b.

Furthermore, the connecting terminals 35a, 35b can be electrically connected via abutment. The semiconductor packages 10, 20 could be fastened, clamped, or welded together to retain the connecting terminals 35a, 35b in abutment.

Moreover, in the semiconductor device 110 shown in FIG. 12, an insulating member (e.g., a resin) can fill the gap between the semiconductor packages 10, 20. Also, the insulating member can be used to encapsulate nearly the entire semiconductor device 110.

It will be appreciated that in the above-mentioned several semiconductor devices, protrusion positions of the output terminal 31 and the power supply terminals 32, 33 are not limited to the examples shown in the above-mentioned figures.

Moreover, although in the example shown in the above FIGS. 1A and 1B, the second semiconductor package 20 is inverted by 180 degrees relative to the first semiconductor package 10, it is not essential to invert the second semiconductor package 20 by 180 degrees. Electrical connection is established by extracting the connecting terminals 35a, 35b from the end of the first metal body 3 between the two semiconductor packages 10, 20.

Also, in one embodiment, the heat sink blocks 6 are not included in the semiconductor device.

Furthermore, semiconductor elements 1, 2 included between the pair of electrode members 3, 4 in the semiconductor packages 10, 20 may be other than the above-mentioned IGBT and FWD semiconductor elements 1, 2. Moreover, the number of semiconductor elements 1, 2 may be one or may be three or more. In addition, the semiconductor device may include three or more semiconductor packages 10, 20 that are electrically connected to each other.

Thus, while only the selected embodiments have been chosen to illustrate the present invention, it will be apparent to those skilled in the art that various changes and modifications can be made therein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A semiconductor device comprising:
    a first semiconductor package with a first semiconductor element, a plurality of first electrode members, and a first encapsulating member, wherein the first semiconductor element is interposed between the plurality of first electrode members, wherein the first electrode members are in electrical communication with and provide heat transfer for the first semiconductor element, wherein the first encapsulating member encapsulates the first semiconductor element between the first electrode members, and wherein an outer surface of each of the first electrode members is exposed from the first encapsulating member;
    a second semiconductor package with a second semiconductor element, a plurality of second electrode members, and a second encapsulating member, wherein the second semiconductor element is interposed between the plurality of second electrode members, wherein the second electrode members are in electrical communication with and provide heat transfer for the second semiconductor element, wherein the second encapsulating member encapsulates the second semiconductor element between the second electrode members, and wherein an outer surface of each of the second electrode members is exposed from the second encapsulating member;
    a first connecting terminal electrically coupled to one of the plurality of the first electrode members and extending outward so as to be exposed from the first encapsulating member; and
    a second connecting terminal electrically coupled to one of the plurality of the second electrode members and extending outward so as to be exposed from the second encapsulating member;
    wherein the first and second connecting terminals abut each other so as to establish electrical connection between the first and second semiconductor packages.

2. The semiconductor device according to claim 1, wherein:
    the first electrode members are disposed in spaced relationship in a first direction;
    the second electrode members are disposed in spaced relationship in the first direction;
    the first and second semiconductor packages are arranged relative to each other in a second direction;
    the first direction is approximately orthogonal to the second direction; and
    the connecting terminals extend outward along the second direction.

3. The semiconductor device according to claim 1, wherein the first connecting terminal is coupled to the one of the plurality of first electrode members such that the outer surface of the one of the plurality of first electrode members is coplanar with an outer surface of the first connecting terminal and such that the outer surface of the first connecting terminal is exposed from the first encapsulating member; and
    the second connecting terminal is coupled to the one of the plurality of second electrode members such that the outer surface of the one of the plurality of second electrode members is coplanar with an outer surface of the second connecting terminal and such that the outer surface of the second connecting terminal is exposed from the second encapsulating member.

4. The semiconductor device according to claim 1, wherein the first and second connecting terminals are covered by an electrically insulating member.

5. The semiconductor device according to claim 4, wherein the electrically insulating member includes a first protruding portion, which is coupled to the first encapsulating member, and a second protruding portion, which is coupled to the second encapsulating member, such that the first and second protruding portions cooperate to cover the first and second connecting terminals.

6. The semiconductor device according to claim 4, wherein the first and second connecting terminals are at least partially enclosed by the insulating member, and the insulating member is removably coupled to the first and second connecting terminals.

7. The semiconductor device according to claim 1, wherein:
the first electrode members are disposed in spaced relationship in a first direction, and the second electrode members are disposed in spaced relationship in the first direction; one of the outer surfaces of the first electrode members is the first connecting terminal, and
one of the outer surfaces of the second electrode members is the second connecting terminal, such that the first and second semiconductor packages can be stacked in the first direction to establish electrical connection between the first and second terminals.

8. A semiconductor device comprising:
a first semiconductor package with a first semiconductor element, a plurality of first electrode members, and a first encapsulating member, wherein the first semiconductor element is interposed between the plurality of first electrode members, wherein the first electrode members are in electrical communication with and provide heat transfer for the first semiconductor element, wherein the first encapsulating member encapsulates the first semiconductor element between the first electrode members, and wherein an outer surface of each of the first electrode members is exposed from the first encapsulating member;
a second semiconductor package with a second semiconductor element a plurality of second electrode members, and a second encapsulating member, wherein the second semiconductor element is interposed between the plurality of second electrode members, wherein the second electrode members are in electrical communication with and provide heat transfer for the second semiconductor element, wherein the second encapsulating member encapsulates the second semiconductor element between the second electrode members, and wherein an outer surface of each of the second electrode members is exposed from the second encapsulating member;
a first connecting terminal electrically coupled to one of the plurality of the first electrode members and extending outward so as to be exposed from the first encapsulating member;
a second connecting terminal electrically coupled to one of the plurality of the second electrode members and extending outward so as to be exposed from the second encapsulating member; and
a conductive junction material interposed between the first and second connecting terminals so as to establish electrical connection between the first and second semiconductor packages.

9. The semiconductor device according to claim 8, wherein:
the first electrode members are disposed in spaced relationship in a first direction;
the second electrode members are disposed in spaced relationship in the first direction;
the first and second semiconductor packages are arranged relative to each other in a second direction;
the first direction is approximately orthogonal to the second direction; and
the connecting terminals extend outward along the second direction.

10. The semiconductor device according to claim 8, wherein
the first connecting terminal is coupled to the one of the plurality of first electrode members such that the outer surface of the one of the plurality of first electrode members is coplanar with an outer surface of the first connecting terminal and such that the outer surface of the first connecting terminal is exposed from the first encapsulating member; and
the second connecting terminal is coupled to the one of the plurality of second electrode members such that the outer surface of the one of the plurality of second electrode members is coplanar with an outer surface of the second connecting terminal and such that the outer surface of the second connecting terminal is exposed from the second encapsulating member.

11. The semiconductor device according to claim 8, wherein the first and second connecting terminals are covered by an electrically insulating member.

12. The semiconductor device according to claim 11, wherein the electrically insulating member includes a first protruding portion, which is coupled to the first encapsulating member, and a second protruding portion, which is coupled to the second encapsulating member, such that the first and second protruding portions cooperate to cover the first and second connecting terminals.

13. The semiconductor device according to claim 11, wherein the first and second connecting terminals are at least partially enclosed by the insulating member, and the insulating member is removably coupled to the first and second connecting terminals.

14. The semiconductor device according to claim 8, wherein:
the first electrode members are disposed in spaced relationship in a first direction, and the second electrode members are disposed in spaced relationship in the first direction; one of the outer surfaces of the first electrode members is the first connecting terminal, and
one of the outer surfaces of the second electrode members is the second connecting terminal, such that the first and second semiconductor packages can be stacked in the first direction to establish electrical connection between the first and second terminals.

* * * * *